US006252803B1

United States Patent
Fastow et al.

(10) Patent No.: US 6,252,803 B1
(45) Date of Patent: Jun. 26, 2001

(54) AUTOMATIC PROGRAM DISTURB WITH INTELLIGENT SOFT PROGRAMMING FOR FLASH CELLS

(75) Inventors: Richard Fastow, Cupertino; Sameer S. Haddad, San Jose; Lee E. Cleveland, Santa Clara; Chi Chang, Redwood City, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/692,881

(22) Filed: Oct. 23, 2000

(51) Int. Cl.[7] .................................................. G11C 16/16
(52) U.S. Cl. ................... 365/185.22; 365/185.3; 365/185.33; 365/185.29; 365/185.12; 365/185.11
(58) Field of Search ................... 365/185.22, 185.29, 365/185.3, 185.33, 185.02, 185.11, 185.12, 185.13

(56) References Cited

U.S. PATENT DOCUMENTS

| | | | |
|---|---|---|---|
| 5,359,558 | * 10/1994 | Chang et al. | 365/185.3 |
| 5,642,311 | * 6/1997 | Cleveland et al. | 365/185.3 |
| 5,875,130 | * 2/1999 | Haddad et al. | 365/185.33 |
| 5,901,090 | * 5/1999 | Haddad et al. | 365/185.29 |
| 5,912,845 | * 6/1999 | Chen et al. | 365/185.3 |
| 6,011,721 | * 1/2000 | Sunkavalli | 365/185.22 |

* cited by examiner

Primary Examiner—Andrew Q. Tran
(74) Attorney, Agent, or Firm—Davis Chin

(57) ABSTRACT

A method of erasing a flash electrically-erasable programmable read-only memory (EEPROM) device is provided which includes a plurality of memory cells. An erase pulse is applied to the plurality of memory cells. The plurality of memory cells is overerase verified and an overerase correction pulse is applied to the bitline to which the overerased memory cell is attached. This cycle is repeated until all cells verify as not being overerased. The plurality of memory cells is erase verified and another erase pulse is applied to the memory cells if there are undererased memory cells and the memory cells are again erase verified. This cycle is repeated until all cells verify as not being undererased. After erase verify is completed, the plurality of memory cells is soft program verified and a soft programming pulse is applied to the those memory cells in the plurality of memory cells which have a threshold voltage below a pre-defined minimum value. This cycle is repeated until all of those memory cells in the plurality of memory cells which have a threshold voltage below the pre-defined minimum value are brought above the pre-defined minimum value. The erase method is considered to be finished when there are no memory cells in the plurality of memory cells which have a threshold voltage below the pre-defined minimum value.

5 Claims, 3 Drawing Sheets

AUTOMATIC PROGRAM DISTURB WITH INTELLIGENT SOFT PROGRAMMING FOR FLASH CELLS

BACKGROUND OF THE INVENTION

1. Field of the Invention

This invention relates generally to the art of microelectronic integrated circuits. More specifically, this invention relates to the art of erasing microelectronic flash Electrically Erasable Programmable Read-Only Memory devices which raises threshold voltages of erased cells having threshold voltages below a pre-defined minimum threshold voltage to above this pre-defined minimum threshold voltage after erase verify.

2. Description of the Prior Art

A microelectronic flash or block erase Electrically Erasable Programmable Read-Only Memory (Flash EEPROM) device includes an array of cells that can be independently programmed and read. The size of each cell and thereby the memory device are made small by omitting transistors known as select transistors that enable the cells to be erased independently. As a result, all of the cells must be erased together as a block.

A flash memory of this type includes individual Metal-Oxide-Semiconductor (MOS) field effect transistor memory cells, each of which includes a source, a drain, a floating gate and a control gate to which various voltages are applied to program the cell with a binary 1 or 0, to erase all of the cells as a block, to read the cell, to verify that the cell is erased or to verify that the cell is not overerased.

The memory cells are connected in an array of rows and columns, with the control gates of the cells in a row being connected to a respective wordline and the drains of the cells in a column being connected to a respective bitline. The sources of all the cells are connected together. This arrangement is known as a NOR memory configuration.

A cell is programmed by applying a voltage, typically 9 volts to the control gate, applying a voltage of approximately 5 volts to the drain and grounding the source causing hot electrons to be injected from a drain depletion region in to the floating gate. Upon removal of the respective programming voltages, the injected electrons are trapped in the floating gate creating a negative charge therein that increases the threshold voltage of the cell to a value in excess of approximately 4 volts.

A cell is read by applying typically 4 volts to the wordline to which the control gate of the cell is connected, applying 1 volt to the bitline to which the drain of the cell is connected, grounding the source, and sensing the bitline current. If the cell is programmed and the threshold voltage is relatively high (4 volts)1, the bitline current will be zero or at least relatively low. If the cell is not programmed or erased the threshold voltage will be relatively low (2 volts), the control gate voltage will enhance the channel, and the bitline current will be relatively high.

A cell can be erased in several ways. In one arrangement, applying a relatively high voltage, typically 12 volts, to the source, grounding the control gate and allowing the drain to float erases a cell. These applied voltages cause the electrons that were injected into the floating gate during programming to undergo Fowler-Nordheim tunneling from the floating gate through the thin tunnel oxide layer to the source, In another arrangement, applying a negative voltage on the order of −10 volts to the control gate, applying 5 volts to the source and allowing the drain to float also erases a cell. A further method of erasing a cell is by applying 5 V to the P-well and −10 V to the control gate while allowing the source/drain to float.

A problem with the conventional flash EEPROM cell arrangement is that due to manufacturing tolerances, some cells become over-erased before other cells are sufficiently erased. The floating gates of the over-erased cells are depleted of electrons and become positively charged. The over-erased cells function as depletion mode transistors that cannot be turned off by normal operating voltages applied to their control gates. The cells functioning as depletion mode transistors introduce leakage current during subsequent program and read operations.

More specifically, during program and read operations only one wordline connected to the control gates of a row of cells is held high at a time, while the other wordlines are grounded. A positive voltage is applied to the drains of all of the cells and if the threshold voltage of an unselected cell is zero or negative, the leakage current will flow through the source, channel and drain of the cell.

The undesirable effect of the leakage current from the over-erased cells is as follows. In a typical flash EEPROM, the drains of a large number of memory transistor cells, for example 512 transistor cells are connected to each bitline. If a substantial number of cells on the bitline are drawing background leakage current, the total leakage current on the bitline can exceed the cell read current. This makes it impossible to read the state of any cell on the bitline and therefore renders the memory inoperative.

Because the background leakage current of a cell varies as a function of threshold voltage, the lower (more negative) the threshold voltage the higher the leakage current. It is therefore desirable to prevent cells from being over-erased and reduce the threshold voltage distribution to as low a range as possible, with ideally all cells having the same threshold voltage after erase on the order of 2 volts.

It is known in the art to reduce the threshold voltage distribution by performing an over-erase correction operation, which reprograms the most over-erased cells to a higher threshold voltage. An over-erase correction operation of this type is generally known as Automatic Programming Disturb (APD).

An APD method referred to as Automatic Programming Disturb Erase (APDE) is disclosed in U.S. Pat. No. 5,642,311, entitled "OVERERASE CORRECTION FOR FLASH MEMORY WHICH LIMITS OVERERASE AND PREVENTS ERASE VERIFY ERRORS," issued Jun. 24, 1997, to Lee Cleveland. This patent is assigned to the same assignee as the present invention and is incorporated herein by reference in its entirety. The method includes sensing for over-erased cells and applying programming pulses thereto, which bring their threshold voltages back up to acceptable values.

Following application of an erase pulse, under-erase correction is first performed on a cell-by-cell basis by rows. The cell in the first row and column position is addressed and erase verified by applying 4 volts to the control gate (wordline), 1 volt to the drain (bitline), grounding the source, and using sense amplifiers to sense the bitline current to determine if the threshold voltage of the cell is above a value of, for example, 2 volts. If the cell is under-erased, indicated by a threshold voltage above 2 volts, the bitline current will be low. In this case, an erase pulse is applied to all of the cells, and the first cell is erase verified again.

In the method described in U.S. Pat. No. 5,642,311, after application of each erase pulse and prior to a subsequent erase verify operation, over-erase correction is performed on all the cells in the memory. Over-erase verification is performed on the bitlines of the array or memory in sequence by grounding the wordlines, applying typically 1 volt to each bitline in sequence and sensing the bitline current. If the bitline current is above a predetermined value at least one of the cells connected to the bitline is over-erased and is drawing leakage current. In this case, an over-erase correction pulse is applied to the bitline. The over-erase correction pulse is a pulse of approximately 5 volts applied to the bitline for a predetermined length of time, typically 100 μs.

After application of the over-erase correction pulse to the bitline, the cells on the bitline are over-erase verified again. If the bitline current is still high indicating that an over-erased cell still remains connected to the bitline, another over-erase correction pulse is applied to the bitline. This procedure is repeated, as many times as necessary until the bitline current is reduced to the predetermined value that is lower than the read current. Then, the procedure is performed for the rest of the cells in the first row and following rows until all of the cells in the memory have been erase verified.

By performing the over-erase correction procedure after each erase pulse, the extent to which cells are over-erased is reduced, improving the endurance of cells. Further, because over-erased cells are corrected after each erase pulse bitline leakage current is reduced during erase verify, thus preventing under-erased cells from existing upon completion of the erase verify procedure.

In U.S. Pat. No. 5,359,558 issued on Oct. 25, 1994, to Chung K. Chang et al. and entitled "Flash EEPROM Array with Improved High Endurance," there is disclosed an over-erased bit correction structure which includes sensing circuitry for detecting column leakage indicative of an over-erased bit during an APDE mode of operation and a pulse counter for applying program pulses so as to program back the over-erased memory cells. Further, in U.S. Pat. No. 5,875,130 issued on Feb. 23, 1999, to Sameer S. Haddad et al. and entitled "Method for Programming Flash Electrically Erasable Programmable Read-Only Memory," there is disclosed an overerase correction procedure which includes applying an operational pulse to a cell and applying a bias voltage between the source and substrate of the cell while the operational pulse is being applied. The operational pulse can be an overerase correction pulse or a programming pulse.

U.S. Pat. No. 5,901,090 issued on May 4, 1999, to Sameer S. Haddad et al. and entitled "Method for Erasing Flash Electrically Erasable Programmable Read-Only Memory (EEPROM)," teaches an overerase correction or soft programming procedure which includes applying an erase pulse to a plurality of cells and applying overerase correction pulses to the plurality of cells so that the threshold voltages of all cells will be above a $V_T$LOW. In addition, there is taught in U.S. Pat. No. 6,011,721 issued on Jan. 4, 2000, to Ravi S. Sunkavalli and entitled "Method for Sensing State of Erasure of Flash Electrically Erasable Programmable Read-Only Memory (EEPROM)" a sensing procedure which enables accurate calculation of the state of erasure of the memory cells as a predetermined function of a sensed source voltage. The '558, '130, '090 and '721 patents are all assigned to the same assignee as the present invention and are incorporated herein by reference in their entirety.

Furthermore, in U.S. Pat. No. 5,912,845 issued on Jun. 15, 1999, to Chia-Shing Chen et al. and entitled "Method and Circuit for Substrate Current Induced Hot E Injection (SCIHE) Approach for VTConvergence at Low $V_{cc}$ Voltage" there is disclosed a method for soft programming memory cells in a floating gate memory device which includes a soft program to generate pulses for quickly repairing over-erased cells and for limiting the amount of current generated during the process. During the soft programming, a gate voltage, a drain voltage, and a well voltage are applied to the control gate, drain, and well, respectively. An active limiter is coupled to the source in order to render a high efficiency for the soft programming process. This '845 patent is likewise incorporated herein by reference in its entirety.

The erase scheme of the present invention represents a significant improvement over the aforementioned '558, '130, '090, '721, and '845 patents by preventing false erase verify readings and tightening the threshold voltage distribution of the memory cells after erase. This is achieved in the instant invention by combining optimally the features of the automatic program disturb erase (APDE) mode of operation and the soft programming technique.

SUMMARY OF THE INVENTION

Accordingly, it is a general object of the present invention to provide an improved erase scheme for erasing Flash Electrically Erasable Programmable Read-Only Memory (EEPROM) devices which has traditionally be unavailable heretofore.

It is an object of the present invention to provide a method of erasing a flash electrically-erasable programmable read-only memory (EEPROM) device such that the threshold voltages of over-erased cells are greater than zero during erase and the threshold voltages of the over-erased cells are greater than a pre-defined minimum threshold voltage after erase verify.

It is another object of the present invention to provide a method of erasing a flash electrically-erasable programmable read-only memory (EEPROM) device which includes a APDE procedure being performed initially so as to prevent false erase verify readings and subsequently performing an intelligent soft programming so as to compact the threshold voltage distribution.

It is still another object of the present invention to provide a method of erasing flash electrically-erasable programmable read-only memory (EEPROM) device which includes raising threshold voltages of erased cells having threshold voltages below a pre-defined minimum threshold to above this minimum threshold voltage after erase verify.

In a preferred embodiment of the present invention, there is provided a method of erasing a flash electrically-erasable programmable read-only memory (EEPROM) device which includes a plurality of memory cells. An erase pulse is applied to the plurality of memory cells. The plurality of memory cells is overerase verified and an overerase correction pulse is applied to the bitline to which the overerased memory cell is attached. This cycle is repeated until all cells verify as not being overerased. The plurality of memory cells is erase verified and another erase pulse is applied to the memory cells if there are undererased memory cells and the memory cells are again erase verified. This cycle is repeated until all cells verify as not being undererased.

After erase verify is completed, the plurality of memory cells is soft program verified and a soft programming pulse is applied to the those memory cells in the plurality of memory cells which have a threshold voltage below a pre-defined minimum value. This cycle is repeated until all of those memory cells in the plurality of memory cells which have a threshold voltage below the pre-defined minimum value are brought above the predefined minimum value. The erase method is considered to be finished when there are no memory cells in the plurality of memory cells which have a threshold voltage below the pre-defined minimum value.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENT

Reference is now made in detail to specific embodiments of the present invention that illustrate the best mode presently contemplated by the inventors for practicing the invention. It should be understood that the description of the best mode is merely illustrative and that it should not be taken in a limiting sense.

Figure 1A:
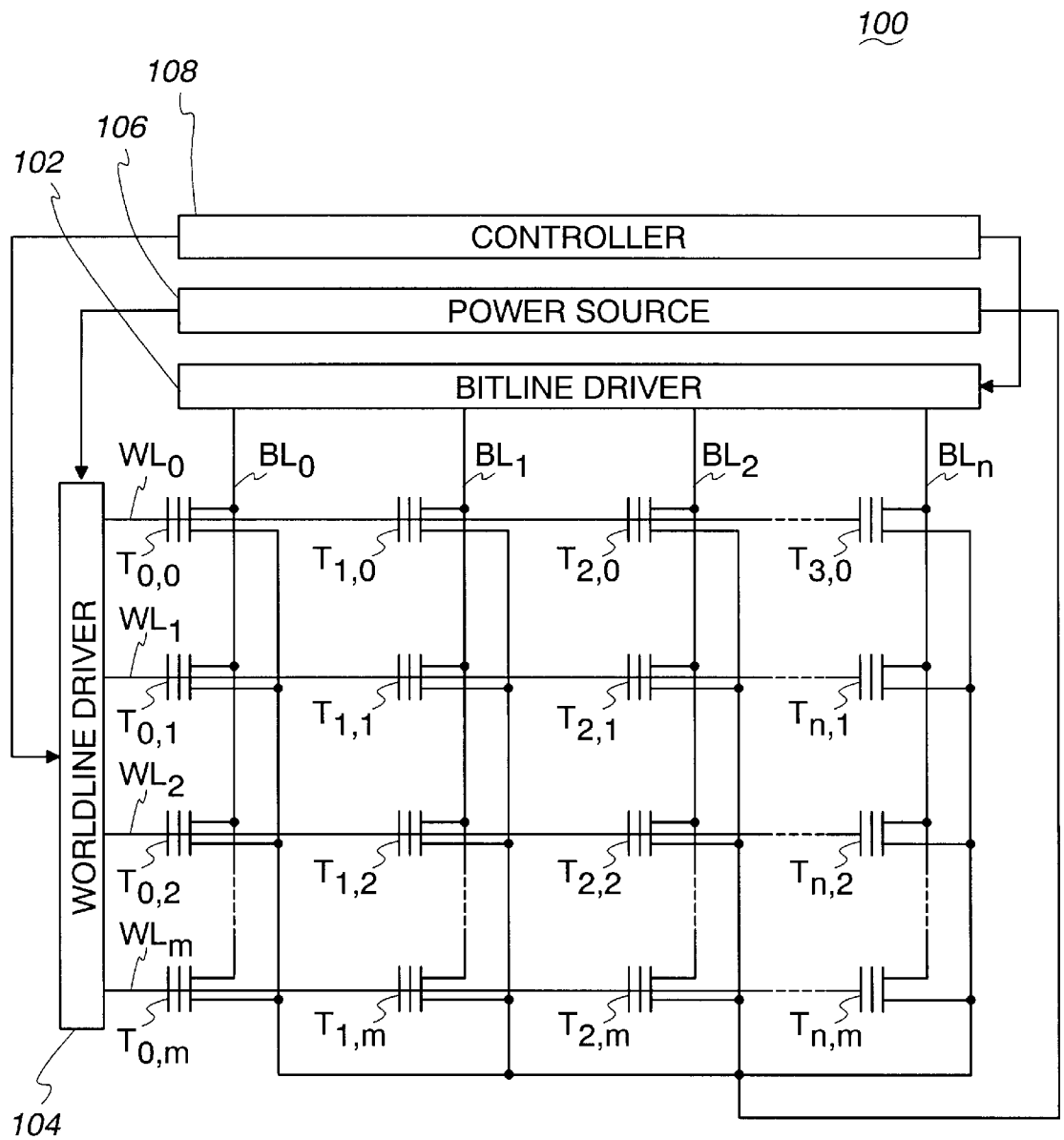
FIG. 1A is a simplified electrical schematic diagram of a flash EEPROM.

FIG. 1A illustrates a basic configuration of a NOR type flash Electrically Erasable Programmable Read-Only Memory (EEPROM) 100 to which the present invention is advantageously applied. The flash memory 100 comprises a plurality of core or memory cells, which are arranged in a rectangular matrix or array of rows and columns. Each row is associated with a wordline (WL), whereas each column is associated with a bitline (BL).

Assuming that there are n columns and m rows, the bitlines are designated as $BL_0$ to $BL_n$ and the wordlines are designated as $WL_0$ to $WL_m$. A bitline driver 102 applies appropriate voltages to the bitlines and a wordline driver 104 applies appropriate voltages to the wordlines. The voltages applied to the drivers 102 and 104 are generated by a power source 106 under the control of a controller 108, which is typically on-chip logic circuitry. The controller 108 also controls the drivers 102 and 104 to address the memory cells individually or collectively as will be described below.

A memory cell is located at each junction of a wordline and a bitline. Each cell includes a Metal-Oxide-Semiconductor (MOS) Field Effect Transistor (FET) having a source and drain formed in a semiconductor substrate, a floating gate, and a control gate separated from the floating gate by a layer of oxide. As should be appreciated, the cells of a flash EEPROM differ from conventional FETs in that they include the floating gate and tunnel oxide layer disposed between the control gate and the semiconductor substrate in which the source and drain are formed.

The cells illustrated in FIG. 1A are designated using the notation $T_{n,m}$ where m is the row (wordline) number and n is the column (bitline) number. The control gates of the cells are connected to respective wordlines, and the drains of the cells are connected to respective bitlines as illustrated. The sources of all of the cells are connected to the power source 106.

Figure 1B:
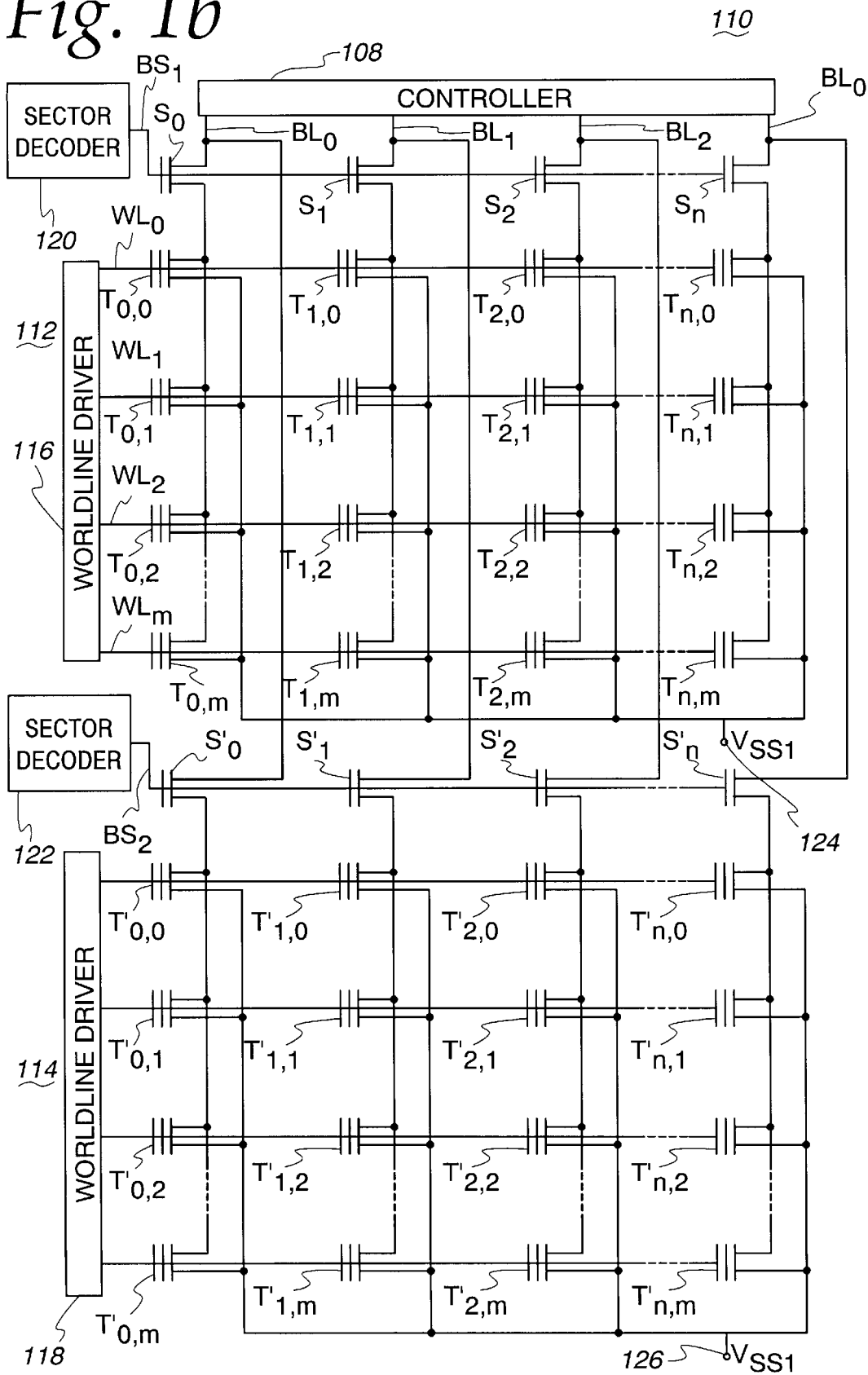
FIG. 1B is similar to FIG. 1A but illustrates a flash EEPROM having cells arranged in two pages or banks.

FIG. 1B illustrates another flash EEPROM memory 110 which is similar to the memory 100 except that the cells are divided into banks (also known as pages or sectors), two of which are shown in FIG. 1B, each of which can be programmed, erased, and read independently. The memory 100 includes a first cell bank or page 112 and a second cell bank or page 114. The memory cells in the first bank 112 are designated in the same manner as in FIG. 1A, whereas a prime symbol is added to the designations of the cells in the second bank 114. The wordlines of the banks 112 and 114 are connected to separate wordline drivers 116 and 118 respectively.

In addition to the memory cells, each bank 112 and 114 includes a select transistor for each bitline. The select transistors for the banks 112 and 114 are designated as $S_0$ to $S_m$ and $S'_0$ to $S'_m$, respectively. The drains of the select transistors are connected to the respective bitlines, whereas the sources of the select transistors are connected to the drains of the transistors for the wordlines $WL_0$ to $WL_m$ and $WL'_0$ to $WL'_m$.

The select transistors differ from the memory cell transistors in that they are conventional MOSFETs and therefore lack floating gates. The select transistors are switching elements rather than memory elements. The gates of the select transistors for the bank 112 are connected to a bank select $BS_1$ of a sector decoder 120 and the gates of the select transistors for the bank 114 are connected to a bank select output $BS_2$ of a sector decoder 122.

The sources of the cells in bank 112 are connected to a common source supply voltage $V_{SS1}$. 124 and the sources of the cells in the bank 114 are connected to a common source supply voltage $V_{SS2}$ 126.

The bank 112 is selected by applying a logically high signal to the bank select line $BS_1$ that turns on the transistors $S_0$. to $S_n$ and connects the bitlines $BL_0$ to $BL_n$ to the underlying memory cells. The bank 112 is deselected by applying a logically low signal to the bank select $BS_1$ that turns off the transistors $S_0$ to $S_n$ and disconnects the memory cells from the bitlines. The bank 114 is selected and deselected in an essentially similar manner using the bank select signal $BS_2$ and select transistors $S'_0$ to $S'_n$. The operation of the memory 110 is essentially similar to that of the memory 100 (FIG. 1A), except that the program, erase and read operations can be performed on the banks 112 and 114 independently.

Figure 2:
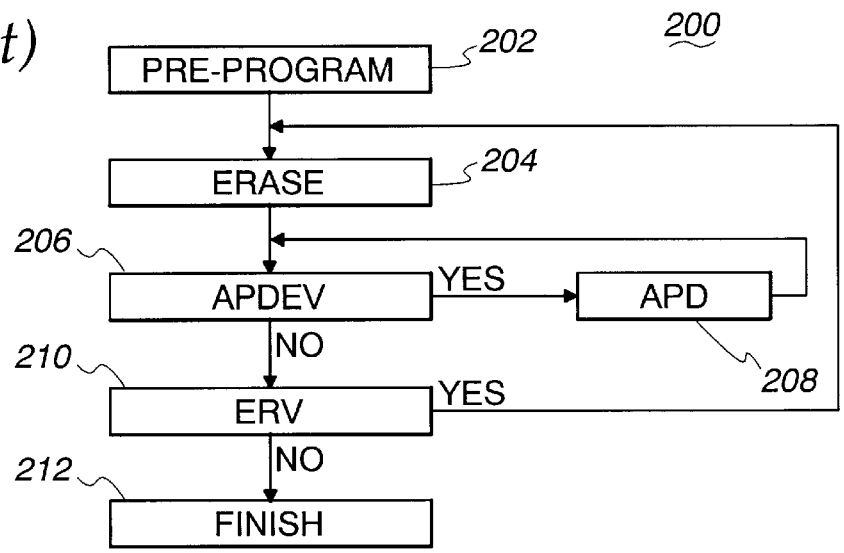
FIG. 2 is the flow diagram of prior art erase method.

FIG. 2 is a flow diagram of a prior art erase method 200. The prior art erase method 200 begins by a pre-programming step 202 in which all the cells in the memory device or in the bank to be erased are programmed to approximately the same charge level. The purpose of this is to avoid having some cells that were either not programmed or that may have lost charge during normal operations to be substantially overerased during the erase procedure. It should be remembered that all the cells either in a bank or in the entire device are erased as a block and therefore all cells would receive the same erase pulse regardless of their individual charge state. All of the cells that are to be erased are given an erase pulse at 204. As discussed above, a cell can be erased in several ways. In one arrangement, applying a relatively high voltage, typically 12 volts, to the source, grounding the control gate and allowing the drain to float erases a cell. This causes the electrons that were injected into the floating gate during programming to undergo Fowler-Nordheim tunneling from the floating gate through the thin tunnel oxide layer to the source. In another arrangement, applying a negative voltage on the order of minus 10 volts to the control gate, applying 5 volts to the source and allowing the drain to float can also erase a cell. In a further arrangement, applying 5 volts to the P-well and minus 10 volts to the control gate while allowing the source and drain to float erases a cell.

After the erase pulse is applied at 204 an over-erase correction operation is performed starting with an over-erase verification (APDEV) step at 206. The over-erase correction operation is necessary because manufacturing tolerances cause some cells to become over-erased before other cells become erased sufficiently. The overerased cells function as depletion mode transistors that cannot be turned off by normal operating voltages applied to their control gates. The overerased cells functioning as depletion mode transistors introduce leakage current during subsequent program and read operations. The over-erase verification step at 206 determines if an overerase correction operation is required. If an over-erase correction pulse is needed, it is applied at 208. The over-erase correction pulse is approximately 5 volts applied to the bitline to which the overerased cell is attached for a predetermined length of time such as 100 µs. As can be appreciated, the over-erase correction pulse is applied to all the cells attached to the bitline. The over-erase correction operation of this type is generally known as Automatic Programming Disturb (APD). As discussed above, a method of APD is referred to as Automatic Programming Disturb Erase (APDE) is disclosed in U.S. Pat. No. 5,642,311, entitled "OVERERASE CORRECTION FOR FLASH MEMORY WHICH LIMITS OVERERASE AND PREVENTS ERASE VERIFY ERRORS," issued Jun. 24, 1997, to Lee Cleveland.

After the cells have been subjected to an APD pulse at 208, the cells are again over-erase verified at 206 and this cycle repeats until it is verified at 206 that there are no over-erased cells. This cycle repeats bitline by bitline until it is verified at 206 that there are no over-erased cells in the array being erased wherein the cells are erase verified at 210 to determine if there are undererased cells. Determining if there are undererased cells can be accomplished by applying 4 volts to the control gate (wordline), 1 volt to the drain (bitline), grounding the source and using sense amplifiers to sense the bitline current and thereby determine if the threshold voltage of the cell is above a predetermined value. If the threshold voltage of the cell is above the predetermined value, the cell is undererased. If it is determined at 210 that there are undererased cells an erase pulse is applied at 204 to the entire memory array and steps from 206 through 210 are repeated until it is verified at 210 there are no undererased cells at which time the erase procedure is considered finished as indicated at 212.

Figure 3:
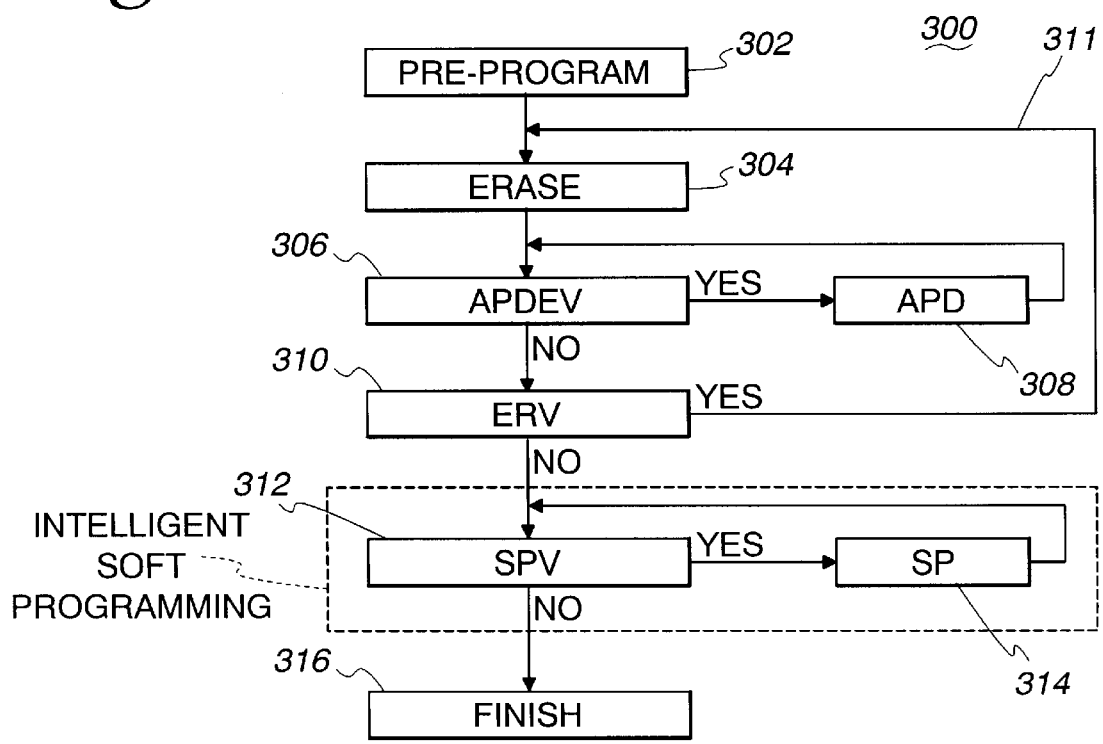
FIG. 3 is the flow diagram of the erase method in accordance with the present invention.

FIG. 3 is the flow diagram of an erase method 300 in accordance with the present invention. In the present invention, an intelligent soft programming algorithm as shown in the dotted line in FIG. 3 is essentially appended to the APDE scheme as was previously described in connection with the prior art of FIG. 2. In particular, the present erase method 300 begins by a pre-programming step 302 in which all the cells in the memory device and in the bank (sector) to be erased are first pre-programmed to approximately the same charge level. Then, an erase pulse is applied simultaneously at the step 304 to all of the cells that are to be erased.

After the erase pulse has been applied at the step 304, an over-erase correction operation is then performed starting with an over-erase verification (APDEV) at the step 306. This over-erase verification at the step 306 is used to determine if an overerase correction operation is required. In other words, it is checked to see whether any cells are overerased (i.e., cells with threshold voltage <0). If a column is found to contain overerased cells, then drain disturb (APD) pulses are applied at step 308 until the threshold voltages of all cells in the leaky column are increased so as to be above zero (>0). The over-erase correction pulse is approximately 5 volts applied to the column (bitline) to which the overerased cell is attached for a predetermined length of time, such as 100 µs.

After the cells have been subjected to the APD pulse at the step 308, the cells are again over-erase verified at the step 306 and this cycle is repeated until it is verified at the step 306 that there are no over-erased cells. This cycle is repeated bitline-by-bitline until it is verified at the step 306 that there are no over-erased cells in the sector being erased. Next, the cells are erase verified (ERV) at the step 310 so as to determine if there are any undererased cells. The process of determining whether there are any undererased cells can be accomplished by applying 4 volts to the control gate (wordline), 1 volt to the drain (bitline), grounding the source and using sense amplifiers to sense the bitline current and thereby determine if the threshold voltage of the cell is above a predetermined value indicative of an undererased cell. If it is determined at the step 310 that undererased cells exist, then the process is returned along line 311 to the step 304 in which another erase pulse is applied to the entire memory array and the step 306 through 310 are repeated until it is verified at the step 310 that no undererased cells exist. At this point, since the threshold voltage of all of the cells are greater than zero (>0), there is prevented false erase verify readings due to undererased cells being masked by excessive column leakage.

After all of the cells in the sector have passed erase verify at the step 310, an intelligent soft programming operation shown in the dotted line is performed starting with a soft program verify (SPV) at step 312. This soft program verify at the step 312 determines whether there are any cells whose threshold voltages are below a pre-defined minimum value $V_{th-min}$. If it is determined that there exists cells whose threshold voltages are below the pre-defined minimum value $V_{th-min}$, then those cells will receive a soft programming pulse (SP) at step 314. This procedure is repeated until all of those cells in the array have their threshold voltages brought to above the pre-defined minimum value $V_{th-min}$, at which point the present erase method is considered to be finished as indicated at step 316. As a result, the threshold voltage $V_T$ distribution of the memory cells are tightened or have been made to be more compact.

The intelligent soft programming is preferably made as a part of an embedded erase sequence algorithm. The actual soft programming pulse uses hot electron injection for charging up the floating gate of the transistor memory cell. It should be clearly understood that this soft programming can be performed either on a bit-by-bit or byte-by-byte basis. The soft programming is performed by applying approximately +5.0 volts to the drain and approximately +3.5 volts to the control gate. The source and the substrate are grounded (e.g., 0 V). The soft programming pulse is a pulse applied to the bitline for a predetermined length of time, typically on the order of 1 µs.

From the foregoing detailed description, it can thus be seen that the present invention provides an improved method of erasing a flash electrically-erasable programmable read-only memory (EEPROM) device which combines optimally a APDE procedure being performed initially and subsequently performing an intelligent soft programming. The APDE procedure serves to prevent false erase verify readings, and the soft programming serves to compact the threshold voltage distribution.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. A method of erasing a flash Electrically-Erasable Programmable Read-Only Memory (EEPROM) device which includes a plurality of field effect transistor memory cells each having a source, drain, floating gate and control gate, comprising the steps of:

(a) applying an erase pulse to the plurality of memory cells;

(b) overerase verifying the plurality of memory cells to determine if there are overerased memory cells in the plurality of memory cells;

(c) applying an overerase correction pulse to a bitline to which an overerased memory cell is attached;

(d) repeating steps (b) and (c) until all of the plurality of memory cells verify as not being overerased;

(e) erase verifying the plurality of memory cells to determine if there are undererased memory cells in the plurality of memory cells;

(f) applying another erase pulse to the plurality of memory cells if there are undererased memory cells in the plurality of memory cells;

(g) repeating steps (b) through (f) until all of the plurality of memory cells verify as not being undererased;

(h) soft program verifying the plurality of memory cells to determine if there are memory cells in the plurality of memory cells which have a threshold voltage below a pre-defined minimum value; and (i) applying a soft programming pulse to those memory cells in the plurality of memory cells which have a threshold voltage below the pre-defined minimum value.

2. A method of erasing as claimed in claim 1, further comprising repeating steps (h) and (i) until all of those memory cells in the plurality of memory cells which have a threshold voltage below the pre-defined minimum value are brought above the pre-defined minimum value.

3. A method of erasing as claimed in claim 2, wherein said erasing method is considered to be finished if it is determined in step (h) that there are no memory cells in the plurality of memory cells which have a threshold voltage below the pre-defined minimum value.

4. A method of erasing as claimed in claim 1, wherein during the step (i) there is applied a voltage of approximately +5.0 volts to the drain, a voltage of approximately +3.5 volts to the control gate, and grounding the source.

5. A method of erasing as claimed in claim 4, wherein the step (i) further includes applying the soft programming pulse for a predetermined length of time which is on the order of 1 µs.

* * * * *